Figure 1:
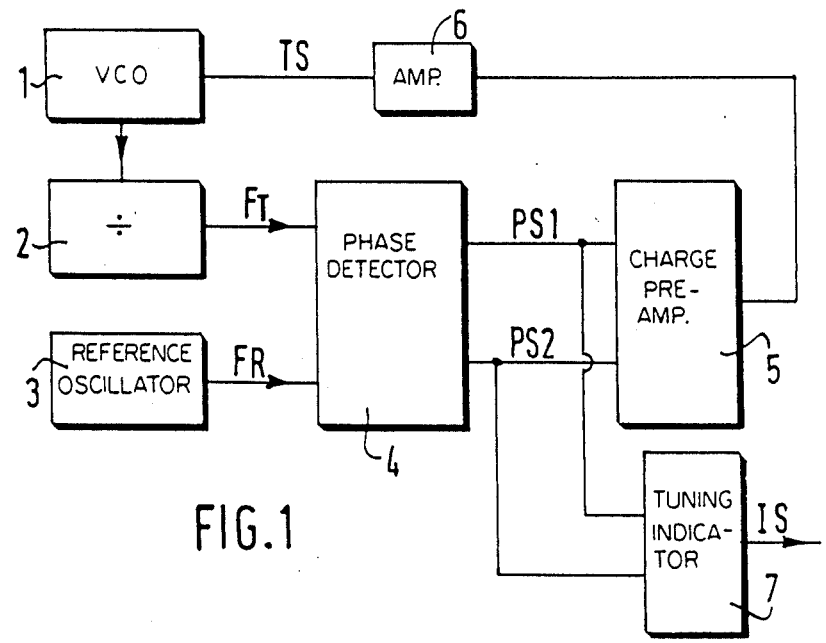

United States Patent [19]

Walbrou et al.

[11] Patent Number: 4,862,105

[45] Date of Patent: Aug. 29, 1989

[54] FREQUENCY SYNTHESIZER COMPRISING A TUNING INDICATOR

[76] Inventors: Pascal Walbrou, 7, impasse César Franck, 14740 Bretevelle L'Org, France; Nicolas P. Cowley, 10 Summerhouse Road, Wroughton, Wiltsire, United Kingdom

[21] Appl. No.: 225,500

[22] Filed: Jul. 28, 1988

[30] Foreign Application Priority Data

Jul. 29, 1987 [FR] France ................. 87 10726

[51] Int. Cl.⁴ ............................... H03L 7/18
[52] U.S. Cl. ...................... 331/1 A; 331/17; 331/27; 331/DIG. 2
[58] Field of Search ............ 331/1 A, 17, 27, DIG. 2

[56] References Cited

U.S. PATENT DOCUMENTS 4,437,072 3/1984 Asami .................. 331/1 A
4,473,805 9/1984 Guhn .................. 331/1 A

OTHER PUBLICATIONS

Dan Hill, "Out-of-lock Detector for Automatic Phase Control", Electronic Design, Nov. 8, 1965, pp. 53-54.

*Primary Examiner*—Siegfried H. Grimm
*Attorney, Agent, or Firm*—Fleit, Jacobson, Cohn, Price, Holman & Stern

[57] ABSTRACT

A frequency synthesizer including an oscillator (1) whose frequency is controlled by a tuning signal (TS), a phase detector (4) and a phase lock loop circuit (5, 6). A tuning indicator (7) has a tolerance on the phase difference between the tuning frequency signal and the reference frequency signal. The phase detector produces a first (PS1) and a second (PS2) phase signal upon leading and lagging, respectively, of the phase between the tuning frequency signal ($F_T$) and a reference frequency signal ($F_R$). The tuning indicator includes delay circuits provided at the input of AND-gates in such manner as to cancel the phase signals (PS1) and (PS2) of a duration less than a predetermined duration, and a register producing a confirmed tuning indication signal (IS) only when the phase signals (PS1) and (PS2) indicate stable tuning during at least two consecutive periods of the reference frequency ($F_R$).

4 Claims, 2 Drawing Sheets

FREQUENCY SYNTHESIZER COMPRISING A TUNING INDICATOR

The invention relates to a frequency synthesizer comprising at least an oscillator whose frequency is controlled by a tuning signal and produces a tuning frequency signal, means for generating a reference frequency signal, a phase detector receiving the tuning frequency signal and the reference frequency signal, a phase lock loop receiving at its input signals produced by the phase detector and producing at its output said tuning signal, and a tuning indicator presenting a tolerance on the phase difference between the tuning frequency signal and the reference signal.

Such a frequency synthesizer is disclosed in U.S. Pat. No. 4,473,805 (RCA Corp.). In said patent the tuning frequency signal is obtained after frequency division and the phase detector also includes the phase locked loop circuit.

The tuning indicator is designed in such manner as to produce an alarm when a phase lock is lost. It comprises an exclusive-OR-gate receiving at one input the reference signal delayed by a first controllable delay as a function of the duty cycles of the signals and at a further input the tuning frequency signal.

The output signal of the EXCLUSIVE-OR-gate is applied to an AND-gate after having been shifted by a second controllable delay and is also applied directly to the further input of this gate. The second controllable delay enables the selection of a tolerance on the phase difference outside which the alarm is triggered.

This tuning indicator has the disadvantage that it depends on duty cycle ratios of the signals which necessitates a specific control of the first delay for different duty cycles and different operating frequencies.

The present invention has for its object to provide a synthesizer having a tuning indicator which is capable of operation whatever the duty cycles of the signals received, and in a wider frequency range, without the necessity of any control in dependence on these parameters, and which is integrable, that is to say it does not require any external components.

To accomplish this object, the frequency synthesizer according to the invention, is characterized in that the phase detector is operated such as to produce at the output a first and a second phase signal when the phase between the tuning frequency signal and the reference frequency signal leads and lags, respectively, the phase lock loop receiving said first and second phase signals, and in that the tuning indicator comprises a first logic circuit producing at its output a first logic signal formed by the logic product of the first phase signal delayed by a predetermined period of time by a first delay circuit and of the first phase signal, a second logic circuit producing at its output a second logic signal formed by the logic product of the second phase signal delayed by the same predetermined period of time by a second delay circuit and of the second phase signal, a third logic circuit producing at its output a third logic signal formed by the logic sum of the first and second logic signals, and a register receiving said reference frequency signal and said third logic signal and producing at its output a tuning indication signal, the register being operated in such a manner that the tuning indication signal level corresponds to a tuning only when the third logic signal has a level indicating a stable tuning during at least two consecutive periods of the reference frequency.

In accordance with a preferred embodiment, the phase detector includes first and second D-type detection flip-flops receiving a high logic level at their data input and at their clock input the tuning frequency signal and the reference frequency signal, respectively, the non-inverting output of the first and second detection flip-flop circuits supplying the first and second phase signals, respectively, and the reset input of the first and second detection flip-flops receiving the logic product of the first and second phase signals.

The register may comprise a frequency divider whose clock input receives the inverse of the reference frequency signal and produces a clock signal which is a sub-multiple of the reference frequency, this clock signal being applied to the clock input of a D-type tuning acquisition flip-flop whose data input receives a low logic level, whose setting input receives the third logic signal and in that it includes a first D-type tuning confirmation flip-flop circuit whose reset-to-zero input receives the signal from the non-inverting output of the tuning acquisition flip-flop and whose data input receives the signal from the inverting output of the tuning acquisition flip-flop and whose clock input receives said clock signal.

In accordance with an advantageous variation, the register is a shift register which comprises n tuning confirmation flip-flops, where n in an integer higher than 1, being reset to zero by the non-inverting output signal of the tuning acquisition flip-flop and receiving at their clock inputs said clock signal, the data input of the $p^{th}$ tuning confirmation flip-flop receiving the signal from the non-inverting output of the $(p-1^{st})$ tuning confirmation flip-flop, the output of the $n^{th}$ tuning confirmation flip-flop producing said tuning signal.

Figure 2A:
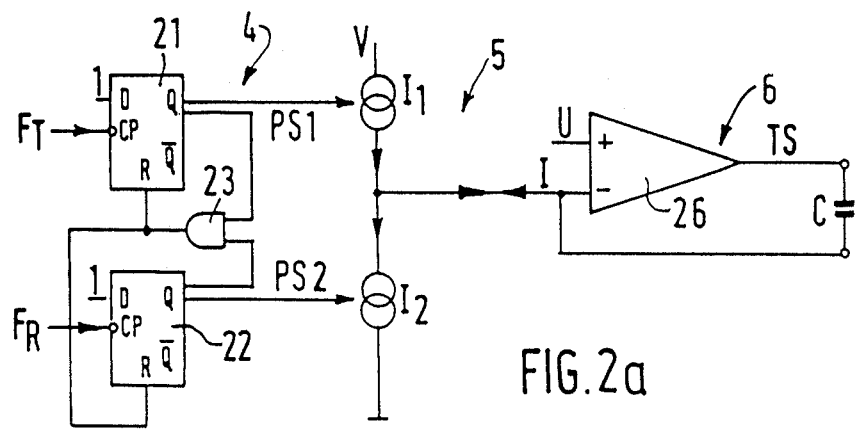
Figure 2B:
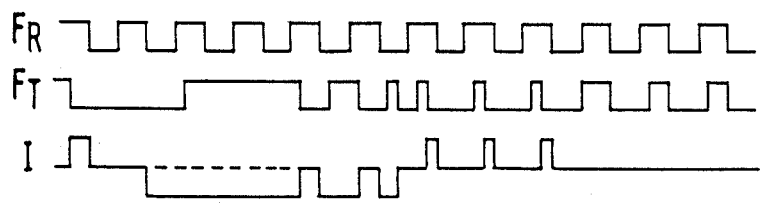
Figure 3A:
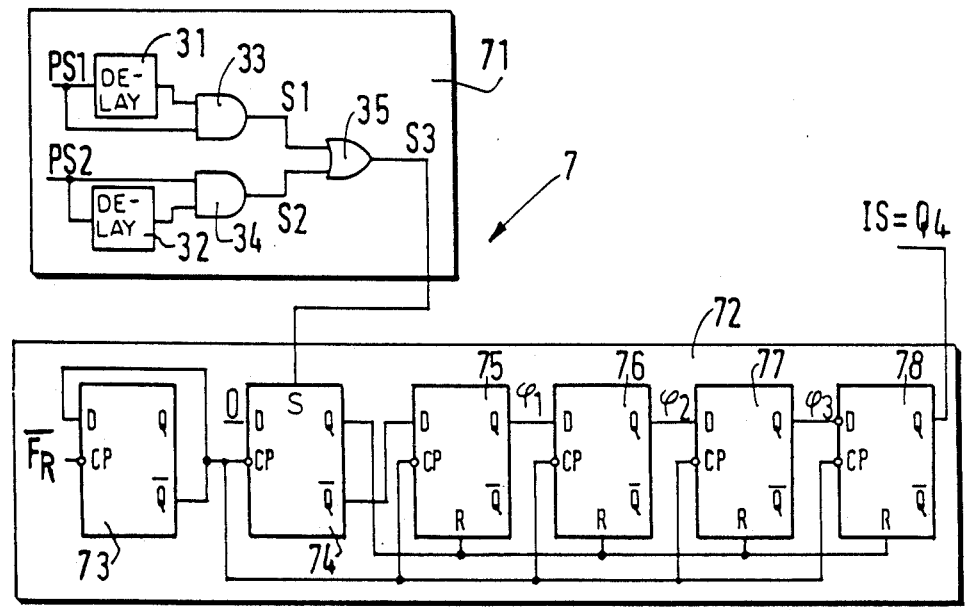
Figure 3B:
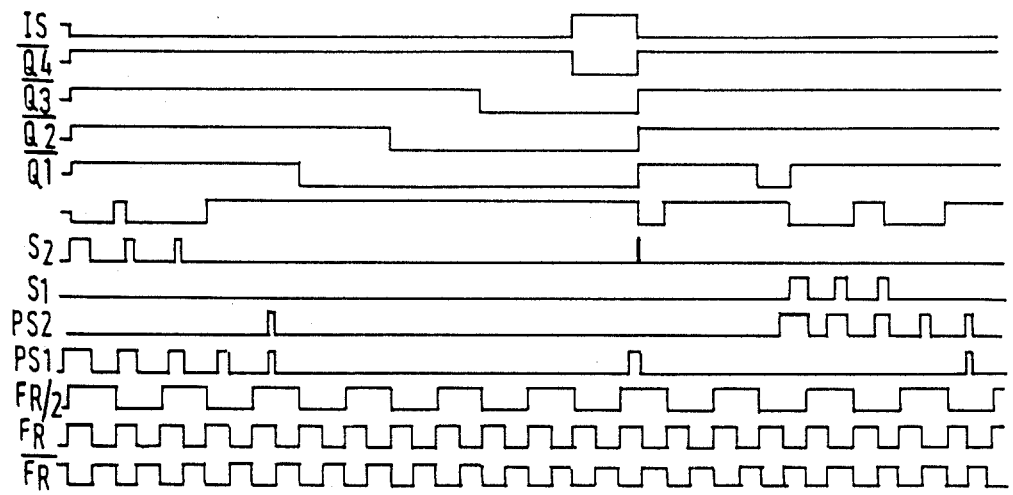

The advantages of the invention and how it can be put into effect will be more apparent from the following description which is given by way of non-limitative example with reference to the accompanying Figures, in which:

FIG. 1 is a circuit diagram of a frequency synthesizer according to the invention, FIGS. 2a and 2b show an embodiment of the phase detector and the phase lock loop of a synthesizer according to the invention, and a time diagram of characteristic signals, FIGS. 3a and 3b show an embodiment of the tuning indicator of a synthesizer according to the invention and the time diagrams of characteristic signals.

As is shown in FIG. 1, a synthesizer according to the invention comprises a voltage-controlled oscillator 1, whose output signal frequency is divided by a programmable divider 2 whose output supplies a tuning frequency signal $F_T$ which is applied to one input of a phase detector 4 whose other input receives a reference frequency signal $F_R$ produced by a frequency generator 3 which comprises, for example, a reference oscillator and a frequency divider dividing by a fixed factor. The programmable frequency divider 2 has for its object to allow tuning of the synthesizer in a wide range of frequencies for application in television sets or in radio receivers, as the case may be, in accordance with several frequency ranges. In the latter case the synthesizer may include several voltage-controlled oscillators between which a switching is effected for the different frequency ranges.

The phase detector 4 produces two output signals upon leading PS1, and upon lagging PS2 respectively of the phase between the tuning frequency signal $F_T$ and the reference signal $F_R$. These signals PS1 and PS2 are utilized in a phase lock loop comprising a charge pre-amplifier 5 and a feedback amplifier 6 producing at its output a tuning signal TS whose voltage determines the value of the frequency of the variable oscillator 1.

A tuning indicator 7 receives at its inputs the two phase signals PS1 and PS2 and produces at its output a tuning indication signal IS.

As is shown in the FIGS. 2a and 2b, the tuning frequency signal $F_T$ is applied to the clock input CP of a D-type flip-flop 21, commonly referred to as detection flip-flop, and the reference frequency signal is applied to the clock input CP of the D-type flip-flop 22, commonly referred to as detection flip-flop. The non-inverting outputs Q of the flip-flops 21 and 22 supply the respective signals PS1 and PS2. An AND-gate 23 receives at its inputs the signals PS1 and PS2 and its output s connected to the reset-to-zero inputs R of the flip-flop circuits 21 and 22. This circuit (21, 22, 23) forms a phase detector with memory. The signals PS1 and PS2 are utilized to control either one or the other of two controllable current sources $I_1$ and $I_2$ of the same intensity and operating in opposite senses (constituting a charge pre-amplifier 5) to apply a current $I=(I_1-I_2)$ to the inverting input of an amplifier 26 which is negatively feedback by a capacitor C, thus forming a charge amplifier 6, and supplying t its output the tuning signal TS. The time diagrams of the signals $F_R$, $F_T$, and I are shown in FIG. 2b. When $F_T$ leads $F_R$, the signal I has a value $I_1$ during a time interval corresponding to the phase deviation. On the other hand, when $F_T$ lags $F_R$, the signal I has a value $-I_1=-I_2$ during a time interval corresponding to the phase deviation. Thus, the phase locked loop tends towards a zero phase deviation, that is to say to agreement between $F_T$ and $F_R$ both as regards frequency and phase.

FIGS. 3a and 3b show that the tuning indication signal IS is obtained from the signals PS1 and PS2 which represent a phase lead and a phase lag, respectively, between the phases of $F_T$ and $F_R$. The signal PS1 is applied to an input of an AND-gate 33 and to the input of a delay circuit 31, whose output signal is applied to the other input of the AND-gate 33. The signal PS2 is applied to an input of an AND-gate 34 and to the input of a delay circuit 32, whose output signal is applied to the other input of the AND-gate 34. The output signals of the AND gates 33 and 34 are applied to the inputs of an OR-gate 35, whose output supplies a signal $S_3$ which is representative of the instantaneous phase condition of the synthesizer relative to an accepted phase deviation by the delay circuits 31 and 32. A delay circuit can , for example, be constituted by an even number of series-arranged inverting amplifiers having a gain equal to unity.

It should be noted that a logic circuit joining two AND-gates whose output signals are applied to an OR-gate has already been employed to obtain a tuning indicator, in this case an indicator indicating the loss or the absence of phase lock. This circuit is the subject of a publication in Electronic Design 13 (Nov. 8, 1965) pages 53-4.

In accordance with this prior art, one of the AND-gates receives a reference frequency and the inverted output of a phase detection flip-flop which receives at its reset input the reference frequency and at its input a signal to be synchronized. The other AND-gate receives the signal to be synchronized and the non-inverted output of the above-defined flip-flop. A pulse is obtained at the output each time a shift equal to one cycle is produced between the signal and the reference frequency. Such a circuit is therefore inherently unsuitable to provide a detection corresponding to a tolerance on the phase difference.

Referring again to FIG. 3a, the signal S3 is applied to the input S of a tuning acquisition flipflop of the D-type, denoted by reference numeral 74, whose data input D receives a signal of a low logic level (O) and whose clock input CP receives the inverted output signal $\overline{Q}$ from a D-type divide-by-two flip-flop denoted by reference numeral 73, whose clock input CP receives the inverse $\overline{F}_R$ of the reference frequency signal. The inverted output $\overline{Q}$ of the flip-flop 73 is fed back to its data input D. The register may comprise one or a plurality of tuning confirmation flip-flops of the D-type, referenced 75, 76, 77, and 78 in the example shown in FIG. 3, which relates to a quadruple flip-flop shift register corresponding to a configuration in which there is agreement during eight consecutive cycles of the reference frequency such as will be demonstrated hereinafter.

The flip-flop 75 receives at its data input D the inverted output signal $\overline{Q}$ from the flip-flop 74 and the non-inverting outputs from the flips-flops 75, 76 and 77 are connected to the data inputs D of the respective flip-flops 76, 77 and 78. The inverted output signal $\overline{Q}$ of the flip-flop 73 is applied to the clock input CT of the flip-flops 75 to 78. The non-inverting output Q of the flip-flop 74 is connected to the reset inputs R of the flip-flops 75 to 78.

Thus, referring now to the time diagram of FIG. 3b, it will be apparent that the signals $Q_1$, $Q_2$, $Q_3$ and $Q_4$ present at the non-inverting outputs Q of the respective flip-flops 75, 76, 77 and 78 correspond to a tuning confirmation during 2, 4, 6 and 8 cycles, respectively. This results, when one confirmation during only two cycles is considered sufficient, in that only the flip-flop 75 must be preserved and the signal $Q_1$ is to be used a tuning indication. In a still more general sense, if, instead of the flip-flop 73, a frequency divider is made operative in a ratio n, the outputs $Q_1$, $Q_2$, $Q_3$ and $Q_4$ will then correspond to a tuning confirmation during n, 2n, 3n and 4n cycles, respectively.

As long as the phase loop is not locked, some of the pulses PS1 or PS2 have a duration exceeding the delay introduced by the delay circuits 31 and 32. As soon as such a pulse appears, the signal $S_3$ is at the high level during a period of time corresponding to the difference between the duration of the pulses PS1 or PS2 and the duration of the delay. The non-inverting output Q of the flip-flop 74 is then adjusted to the low level O, which causes the flip-flops 75 to 78 to be reset to zero.

When the phase loop is locked or almost locked, that is to say as soon as the phase deviation between $F_T$ and $F_R$ remains less than the tolerated deviation determined by the delay circuits 31 and 32, the signal $S_s$ remains at the low level, which has for its result that the non-inverting output Q of the flip-flop 74 is adjusted to the level O as soon as a clock transition appears at the input CP (since the D input of the flipflop 74 permanently receives a O level).

The input D of the flip-flop 75 receives a high level (1) from the inverting output $\overline{Q}$ of the flip-flop 74. In the present example, $Q_4$ reaches the 1-level at the end of eight cycles at the reference frequency provided the loop remains locked or almost locked during this time interval.

A tuning indication signal according to the invention is particularly interesting to the extent to which it renders it possible to take into account the real duration of the locking of the phase loop, increased only by a very short period required by the tuning confirmation, in such manner as to avoid that accidental coincidences between the signals are taken into consideration.

On changing the tuning frequency of a TV receiver, the tuning indicator according to the invention renders it possible to determine at which moment the tuning can be considered as having been obtained without having to wait a predetermined period of time.

During automatic search tuning, for example in a car radio, in which the most powerful transmitter of a radio station must be found, the tuning indicator avoids the necessity to wait a predetermined period on the assumption that, at predetermined frequencies, the tunings correspond to the near or far transmitters to be selected.

What is claimed is:

1. A frequency synthesizer comprising at least an oscillator whose frequency is controlled by a tuning signal and produces a tuning frequency signal, means for generating a reference frequency signal, a phase detector receiving the tuning frequency signal and the reference frequency signal, a phase lock loop receiving at its input signals produced by the phase detector and producing at its output said tuning signal, and a tuning indicator presenting a tolerance on the phase difference between the tuning frequency signal and the reference signal, characterized in that the phase detector (4) is operated such as to produce at the output a first (PS1) and a second (PS2) phase signal when the phase between the tuning frequency signal ($F_T$) and the reference frequency signals ($F_R$) leads and lags, respectively, the phase lock loop receiving said first and second phase signals, and in that the tuning indicator (7) comprises a first logic circuit producing at its output a first logic signal ($S_1$) formed by the logic product of the first phase signal delayed by a predetermined period of time by a first delay circuit (31) and of the first phase signal (PS1), a second logic circuit producing at its output a second logic signal ($S_2$) formed by the logic product of the second phase signal delayed by the same predetermined period of time by a second delay circuit (32) and of the second phase signal (PS2), a third logic circuit producing at its output a third logic signal ($S_3$) formed by the logic sum of the first ($S_1$) and the second ($S_2$) logic signals, and a register (72) receiving said reference frequency signal ($F_R$) and said third logic signal ($S_3$) and producing at its output a tuning indication signal (IS), the register being operated in such a manner that the tuning indication signal level corresponds to a tuning only when the third logic signal ($S_3$) has a level indicating a stable tuning during at least two consecutive periods of the reference frequency.

2. A synthesizer as claimed in claim 1, characterized in that the phase detector comprises first (21) and second (22) D-type detection flip-flops receiving at their data inputs (D) a high logic level and receiving at their clock inputs (CP) the tuning frequency signal ($F_T$) and the reference frequency signal ($F_R$), respectively, the non-inverting outputs Q of the first (21) and the second (22) detection flip-flop circuits supplying the first (PS1) and the second (PS2) phase signals, respectively, and the reset inputs (R) of the first (21) and second (22) detection flip-flops receiving the logic product of the first (PS1) and the second (PS2) phase signals.

3. A synthesizer as claimed in claim 1 characterized in that the register comprises a frequency divider (73) whose clock input (CP) receives the inverted version ($\overline{F_R}$) of the reference frequency signal ($\overline{F_R}$) and produces a clock signal which is a sub-multiple of the reference frequency, this clock signal being applied to the clock input (CP) of a D-type tuning acquisition flip-flop (74) whose data input (D) receives a low logic level, whose input (S) receives the third logic signal ($S_3$) and in that it comprises a first tuning confirmation flip-flop (75) of the D type, whose reset input (R) receives the signal from the non-inverting output (Q) of the tuning acquisition flip-flop (74), whose data input (D) receives the signal from the inverting output ($\overline{Q}$) of the tuning acquisition flip-flop (74), and whose clock input (CP) receives said clock signal.

4. A synthesizer as claimed in claim 3, characterized in that the register is a shift register which comprises n tuning confirmation flip-flops (75–78) wherein n is an integer exceeding 1, which are reset by the signal from the non-inverting output (Q) of the tuning acquisition flip-flop (74) and which receive at their clock inputs (CP) said clock signal, the data input (D) of the $p^{th}$ tuning confirmation flip-flop receiving the signal from the noninverting output (Q) of the $(p-1^{st})$ tuning confirmation flip-flop, the non-inverting output (Q) of the $n^{th}$ tuning confirmation flip-flop supplying said tuning signal (IS=$Q_n$).

* * * * *